United States Patent [19]

Ozaki

[11] Patent Number: 5,753,526
[45] Date of Patent: May 19, 1998

[54] MANUFACTURING PROCESS OF A SEMICONDUCTOR MEMORY DEVICE INCLUDING A TRENCH CAPACITOR AND A SURROUNDING GATE TRANSISTOR

[75] Inventor: Tohru Ozaki, Tokyo, Japan

[73] Assignee: Kabushiki Kaisha Toshiba, Kawasaki, Japan

[21] Appl. No.: 603,069

[22] Filed: Feb. 20, 1996

Related U.S. Application Data

[62] Division of Ser. No. 266,389, Jun. 27, 1994, Pat. No. 5,519,236.

[30] Foreign Application Priority Data

Jun. 28, 1993 [JP] Japan ................... 6-156453

[51] Int. Cl.[6] ............................................. H01L 21/70
[52] U.S. Cl. ..................... 437/52; 437/203; 437/919
[58] Field of Search .................... 437/47, 48, 52, 437/60, 203, 919

[56] References Cited

U.S. PATENT DOCUMENTS

| | | | |
|---|---|---|---|
| 5,470,778 | 11/1995 | Nagata et al. | 437/52 |
| 5,521,115 | 5/1996 | Park et al. | 437/60 |
| 5,545,583 | 8/1996 | Lam et al. | 437/52 |
| 5,547,889 | 8/1996 | Kim | 437/52 |
| 5,573,969 | 11/1996 | Kim | 437/57 |
| 5,583,075 | 12/1996 | Ohzu et al. | 437/203 |

*Primary Examiner*—John Niebling
*Assistant Examiner*—Joni Y. Chang
*Attorney, Agent, or Firm*—Oblon, Spivak, McClelland, Maier & Neustadt, P.C.

[57] ABSTRACT

A method of manufacturing process of a semiconductor device, including the steps of forming a plurality of first trenches in a checkered configuration in a substrate, each of the first trenches having an opening; introducing a first conductivity type impurity from a surface of the substrate so as to form a first conductivity type well in a upper portion of the substrate; forming a capacitor insulating film on a surface of each of the first trenches and burying a storage electrode in each of the first trenches so as to form a trench capacitor in each of the first trenches; burying a first silicon film on each of the storage electrodes of the trench capacitors in the first trenches, etching back each of portions of the first silicon film and removing each of portions of the capacitor insulating films so as to expose portions of side surfaces of the first conductivity type well facing the first trenches; burying a second silicon film doped with a second conductivity type impurity in each of concave portions surrounded by the first silicon films and exposing side surfaces of the first conductivity type well facing the first trenches, and introducing second conductivity type impurities to the first conductivity type well so as to form source regions; and burying a first insulation material on the first and second silicon films in each of the first trenches.

8 Claims, 15 Drawing Sheets

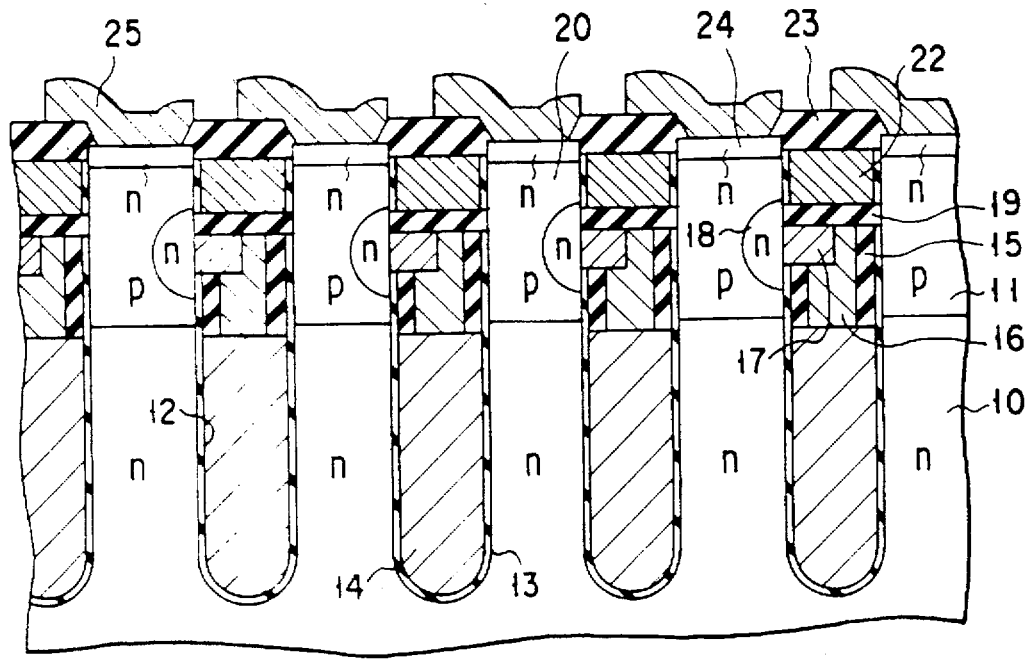
F I G. 2A
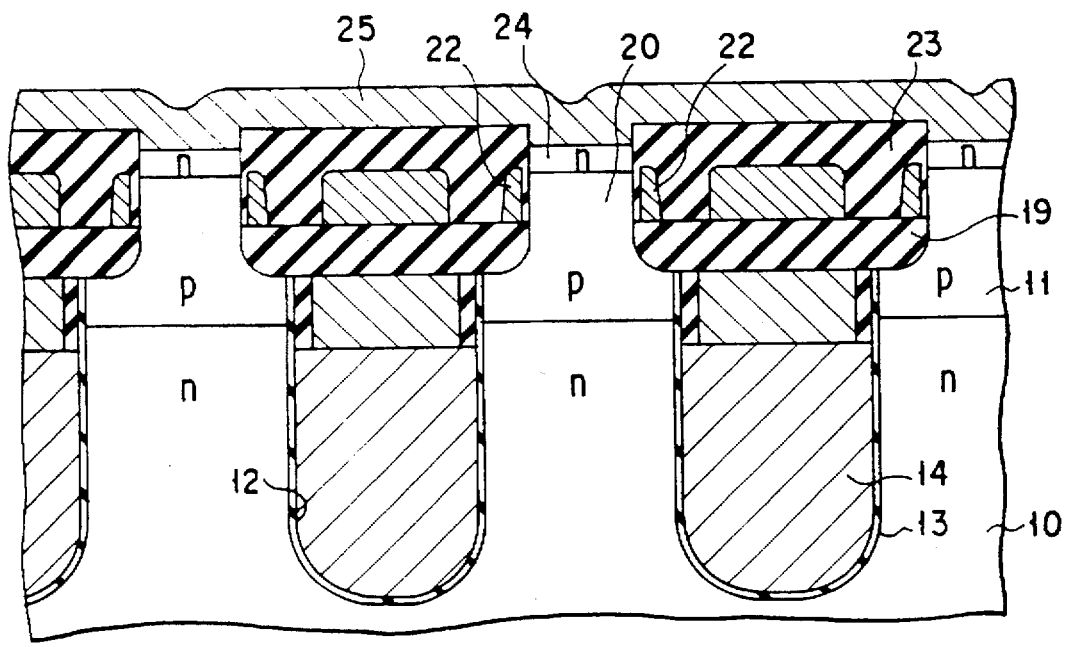
F I G. 2B

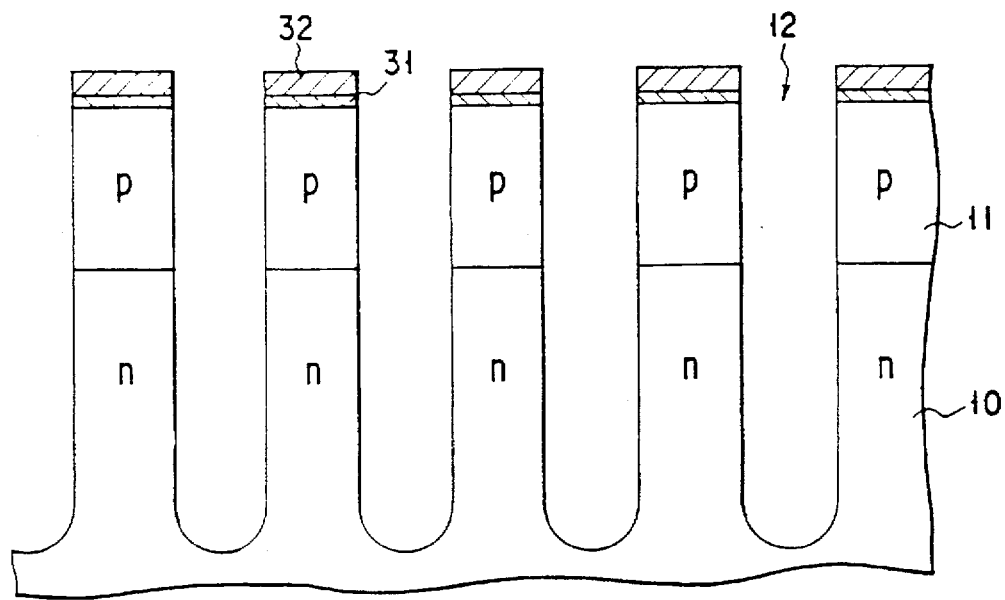
F I G. 3A
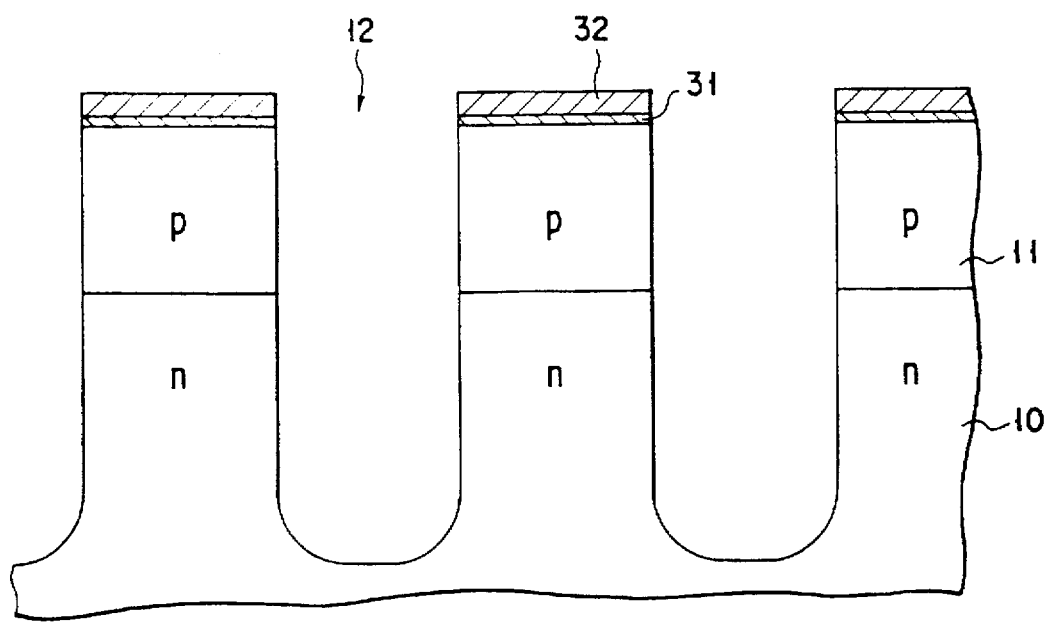
F I G. 3B

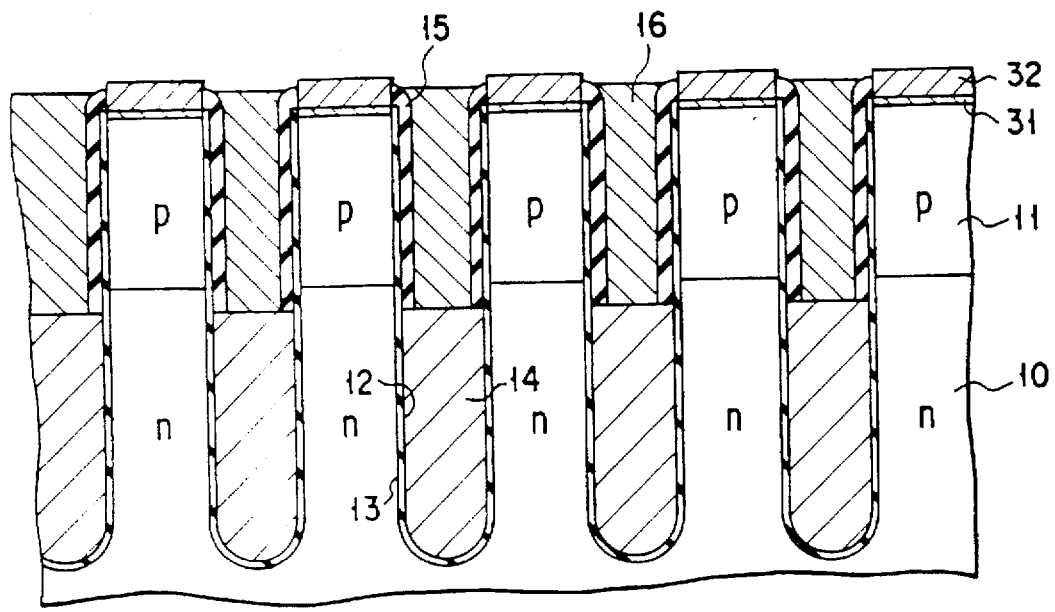
F I G. 4A
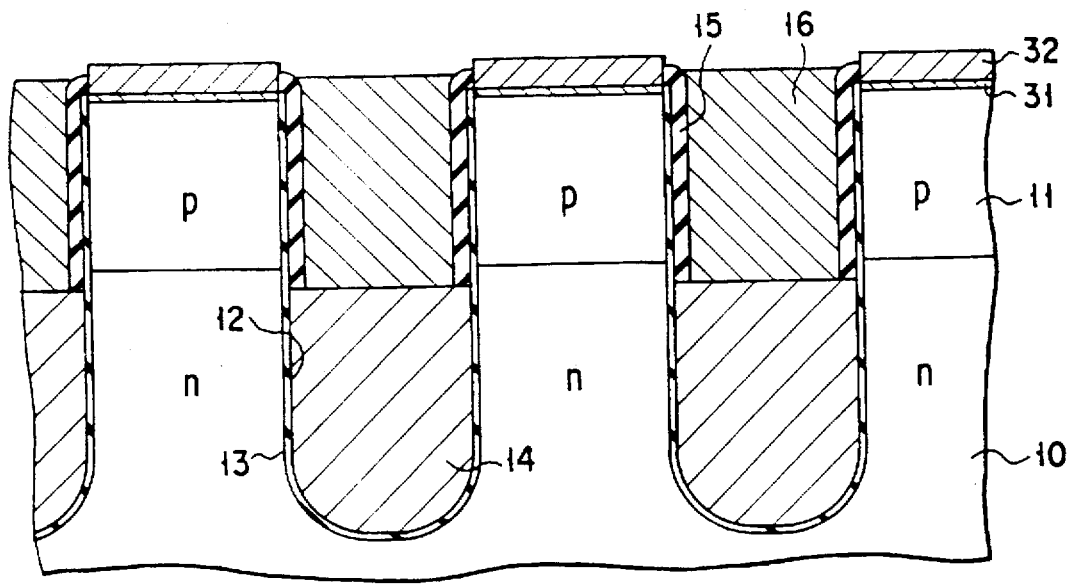
F I G. 4B

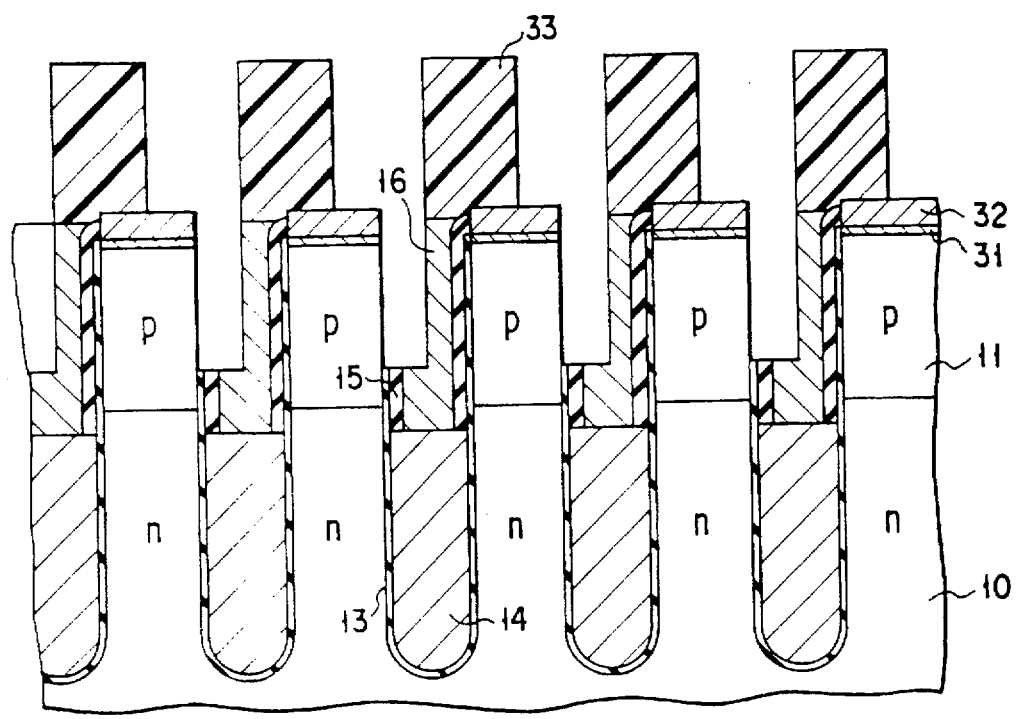
F I G. 5A
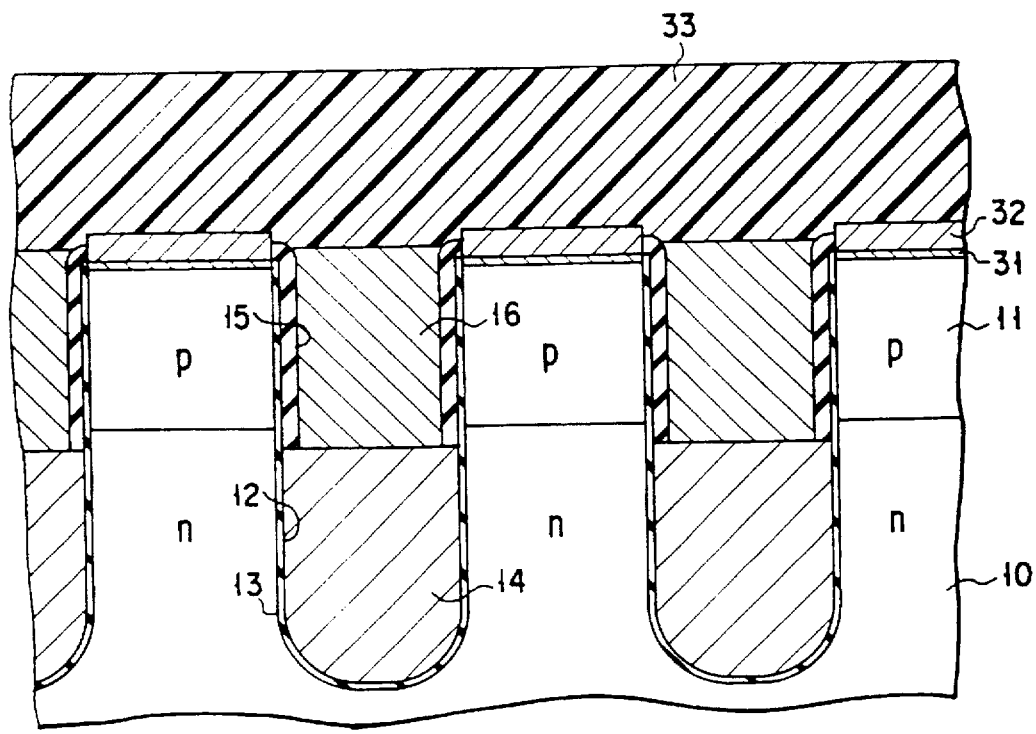
F I G. 5B

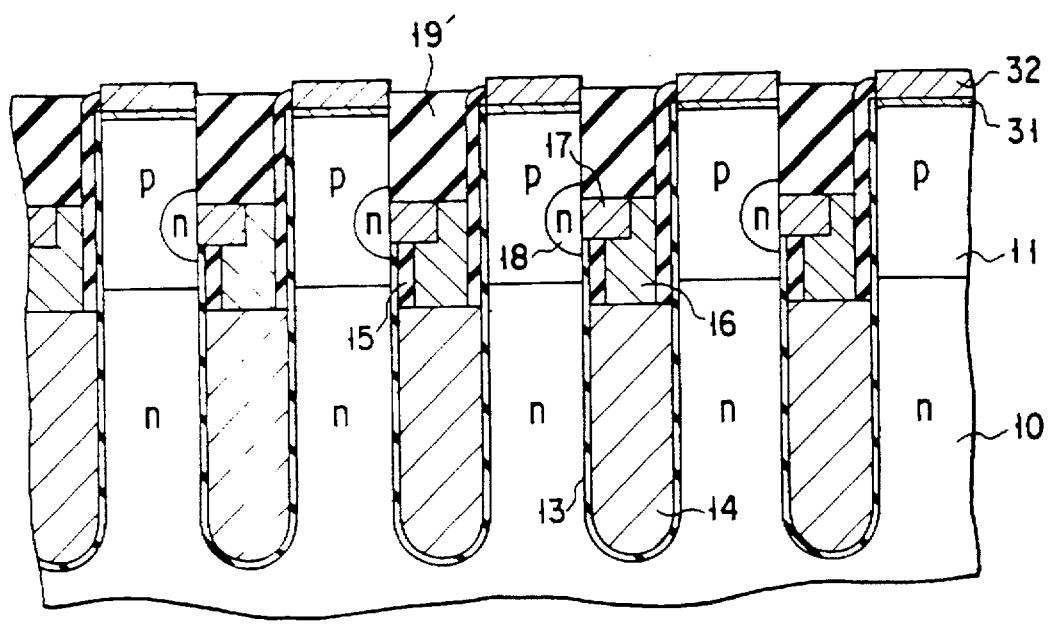
F I G. 6A
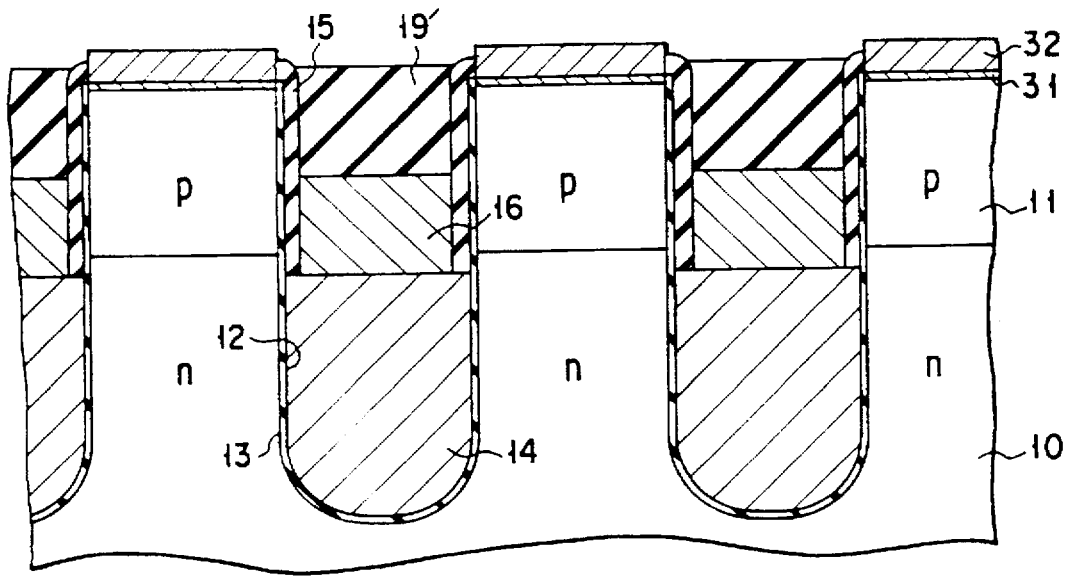
F I G. 6B

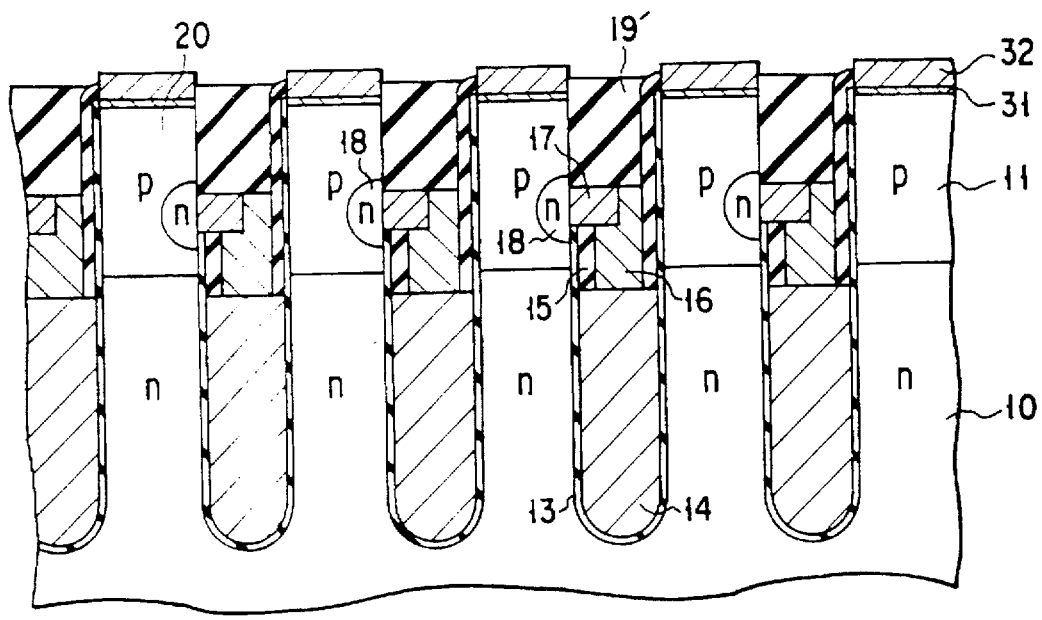
F I G. 7A
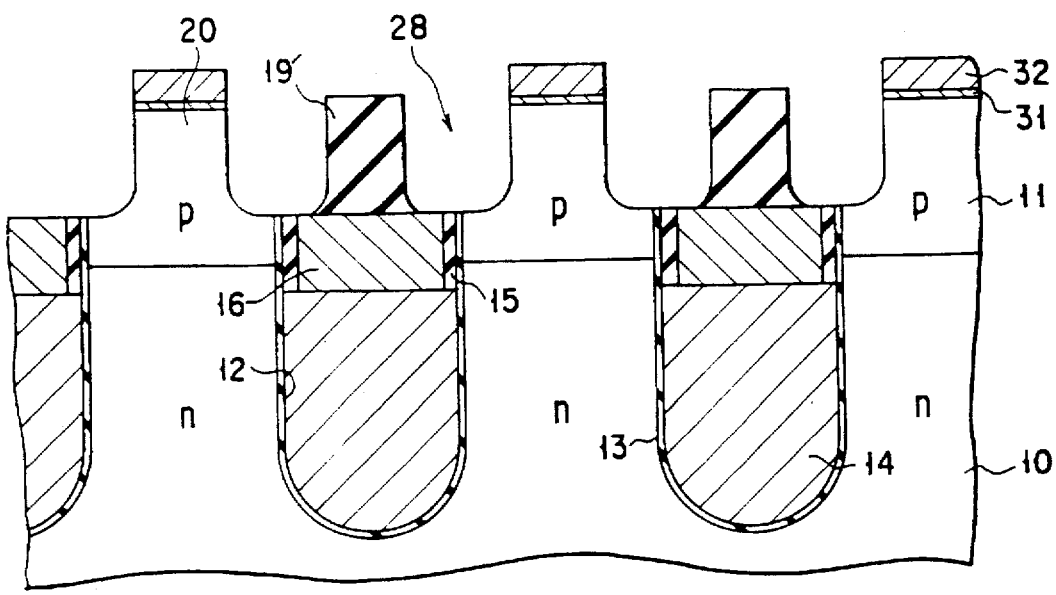
F I G. 7B

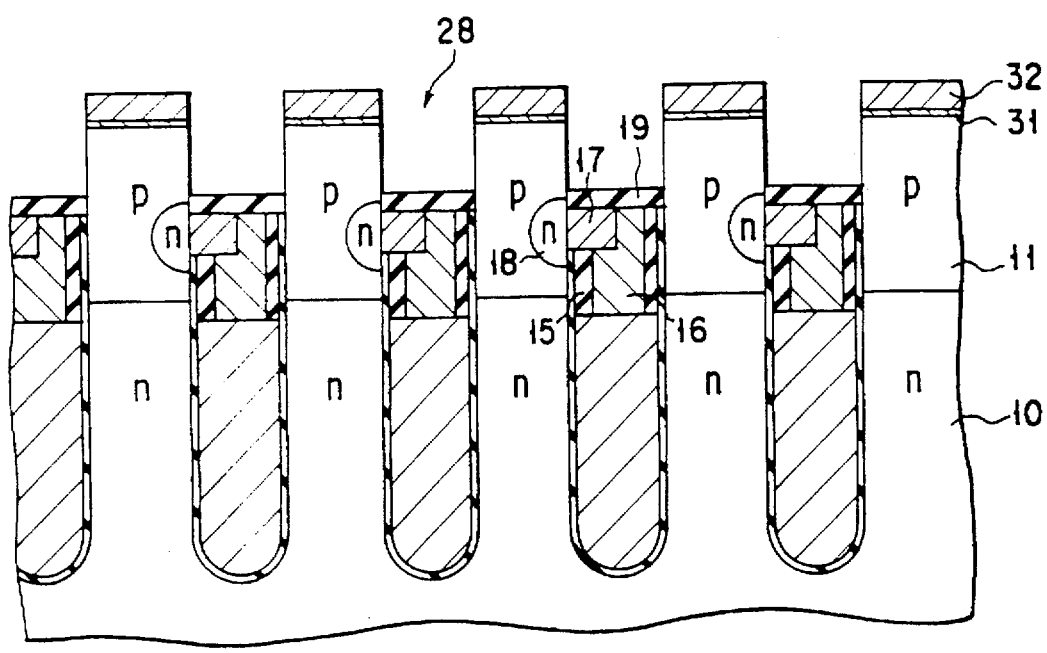
F I G. 8A
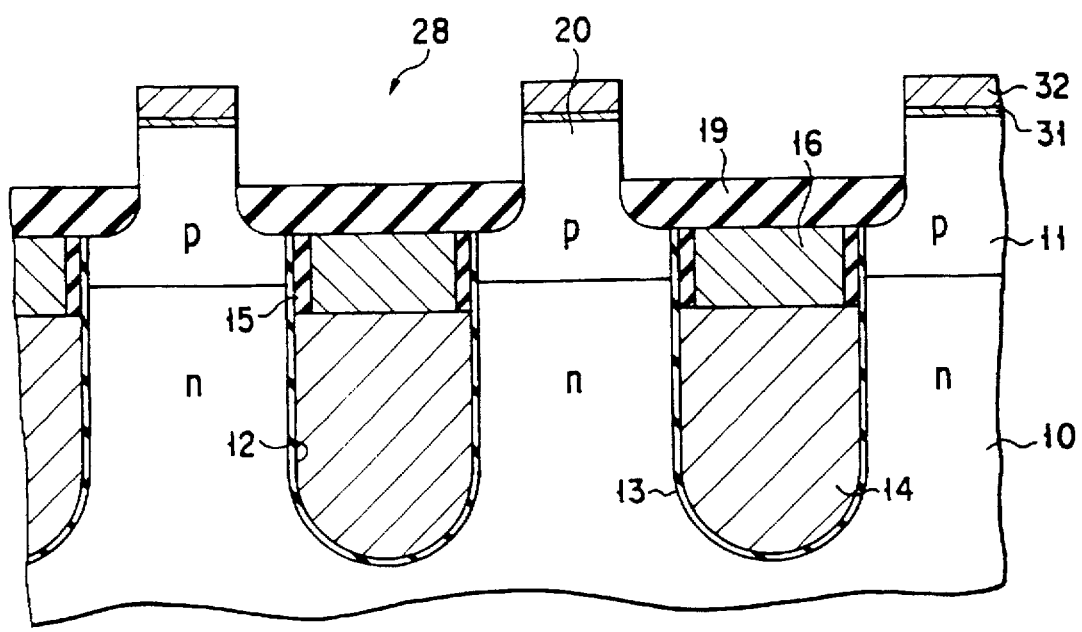
F I G. 8B

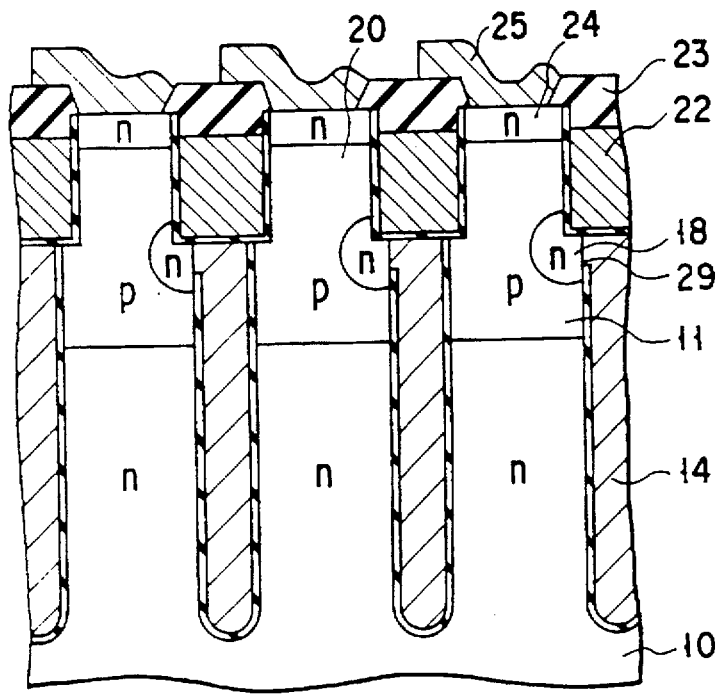
F I G. 12A
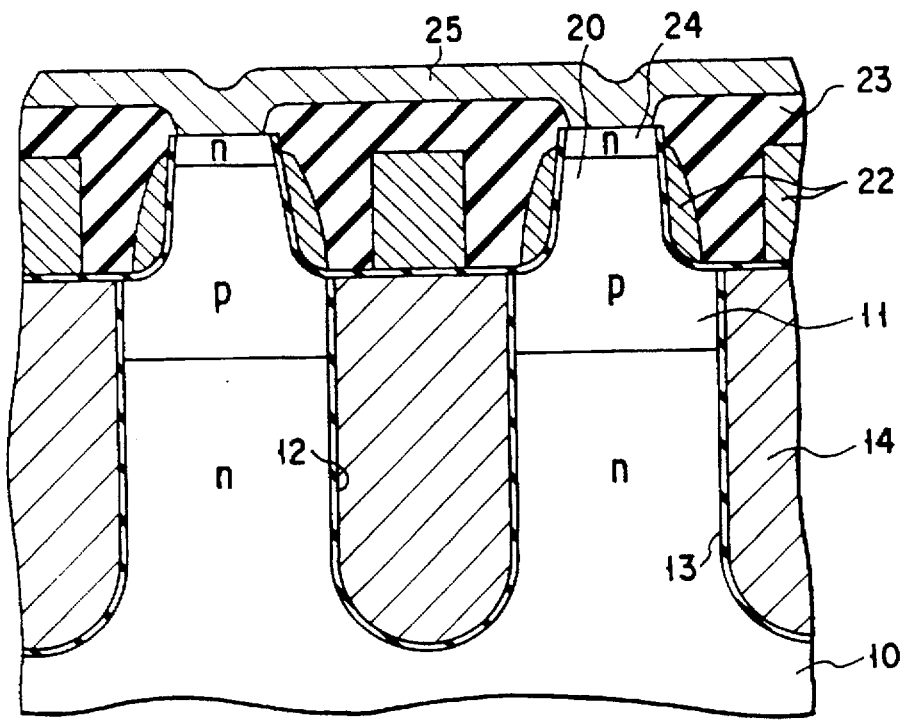
F I G. 12B

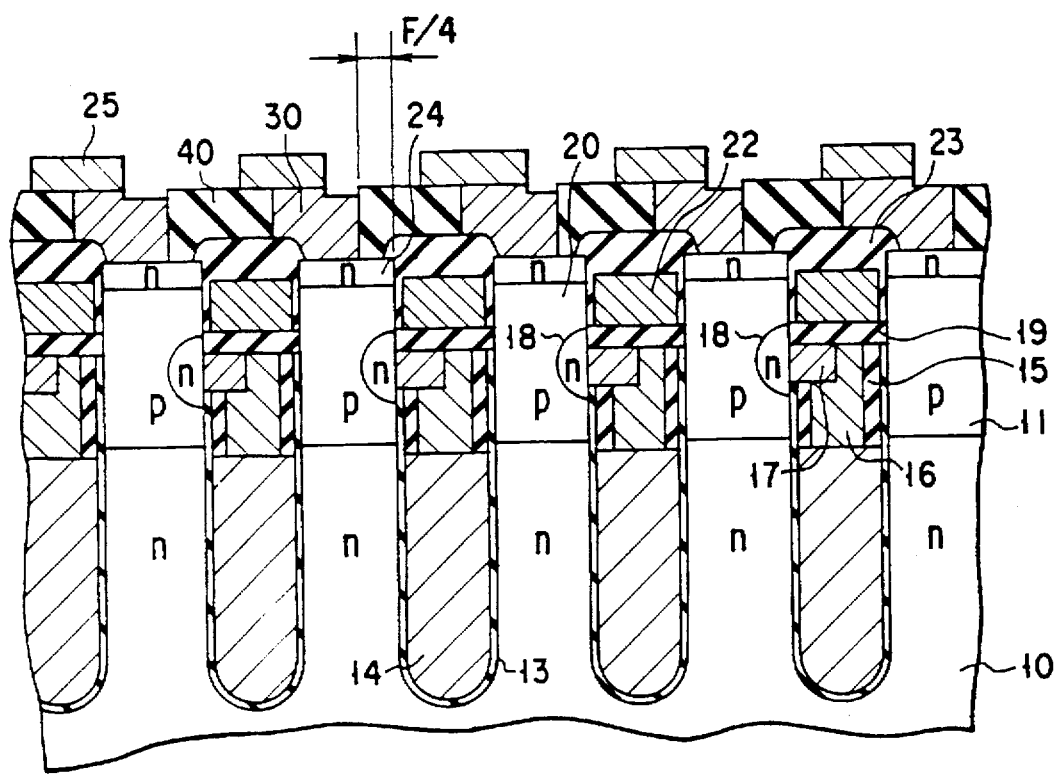
F I G. 13A
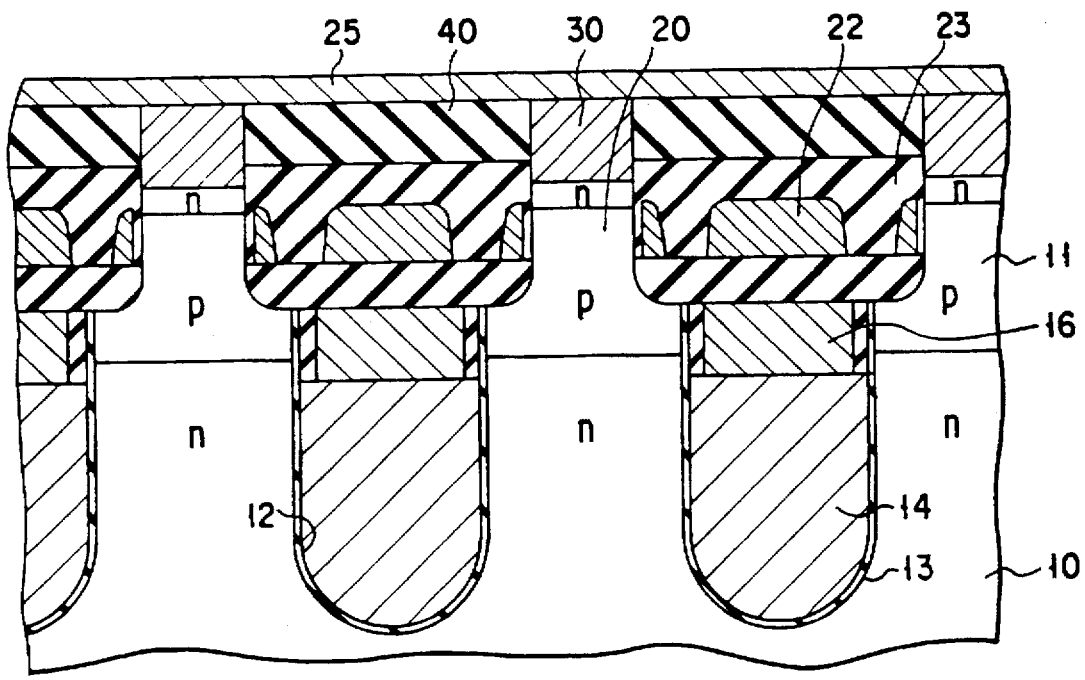
F I G. 13B

MANUFACTURING PROCESS OF A SEMICONDUCTOR MEMORY DEVICE INCLUDING A TRENCH CAPACITOR AND A SURROUNDING GATE TRANSISTOR

This is a Division of application Ser. No. 08/266,389 filed on Jun. 27, 1994, now U.S. Pat. No. 5,519,236.

BACKGROUND OF THE INVENTION

1. Field of the Invention

This invention relates to a semiconductor memory device having at least one memory cell including a trench capacitor and a surrounding gate transistor acting as a switching transistor of the trench capacitor.

2. Description of the Related Art

Recently, an SGT cell (Surrounding Gate Transistor Cell) having a capacitor and a transistor stacked in a vertical direction along a silicon column is proposed. The cell structure has an advantage that the element area of the memory cell can be set within one bit line contact.

However, if this type of cell structure is made with the dimensions (0.15 to 0.20 μm) of 1-Gbit DRAM, the aspect ratio (height/width) of the silicon column is set to 50 to 60 (for example, the height is 9 μm and the width is 0.15 μm). Therefore, there occurs a possibility that the silicon column falls down and is destroyed by the stress generated in the process. Further, if the height is reduced with the width kept unchanged in order to reduce the aspect ratio, a sufficiently large capacitance cannot be obtained, and on the other hand, if the width is increased with the height kept unchanged, a sufficiently large capacitance can be obtained, but the cell area is increased.

As another structure, a memory cell structure as shown in Japanese Patent Disclosure (KOKAI) No. 63-29571 is known. In this structure, a vertical MOS transistor is formed on a trench capacitor. With this cell structure, it is possible to simultaneously attain reduction in the aspect ratio of the silicon column and formation of a capacitor of sufficiently large capacitance. However, in order to form the above cell structure, it is necessary to use the laminating technique using a laminated substrate, it is difficult to align the capacitor and the transistor with each other, and the manufacturing cost rises. Further, in this cell structure, since the channel portion of the transfer gate is set in an electrically floating state, generated holes have no place to escape, making it impossible to cut off the transistor.

SUMMARY OF THE INVENTION

An object of this invention is to provide a manufacturing process of a semiconductor memory device whereby the semiconductor memory device can be manufactured at low cost, an whereby it is possible to prevent collapse or destruction of the silicon column by reducing the aspect ratio of the silicon column while maintaining a sufficiently large capacitance and prevent the substrate from being set into the electrically floating state.

These and objects are achieved according to the present invention by providing a manufacturing process of a semiconductor memory device, including the steps of forming a plurality of first trenches in a checkered configuration in a substrate, each of the first trenches having an opening; introducing a first conductivity type impurity from a surface of the substrate so as to form a first conductivity type well in a upper portion of the substrate; forming a capacitor insulating film on a surface of each of the first trenches and burying a storage electrode in each of the first trenches so as to form a trench capacitor in each of the first trenches; burying a first silicon film on each of the storage electrodes of the trench capacitors in the first trenches, etching back each of portions of the first silicon film and removing each of portions of the capacitor insulating films so as to expose portions of side surfaces of the first conductivity type well facing the first trenches; burying a second silicon film doped with a second conductivity type impurity in each of concave portions surrounded by the first silicon films and exposing side surfaces of the first conductivity type well facing the first trenches, and introducing second conductivity type impurities to the first conductivity type well so as to form source regions; and burying a first insulation material on the first and second silicon films in each of the first trenches.

According to a further embodiment of the present invention, there is provided a new and improved manufacturing process of a semiconductor memory device including the steps of forming a plurality of first trenches in a checkered configuration in a substrate, each of said first trenches having an opening; forming an insulating film on a side wall of each first trench and forming a second trench having a smaller opening than that of the first trench deeper under from a bottom of each first trench; introducing a first conductivity type impurity from a surface of the substrate so as to form a first conductivity type well in an upper portion of the substrate; forming a capacitor insulating film on a side wall of each of second trenches, burying a first conductive film in each of second trenches so as to form a storage electrode, etching back the first conductive film in each of second trenches so as to expose a portion of the capacitor insulating film, and removing a part of the portion of the capacitor insulating film; and burying a silicon film doped with a second conductivity type impurity in each of the second trenches and introducing second conductivity type impurities to the first conductivity well so as to form source regions; and a step of burying a first insulation material in each of the first trenches on the silicon film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2A is a cross sectional view taken along the line A-A' of FIG. 1;

FIG. 2B is a cross sectional view taken along the line B-B' of FIG. 1;

FIGS. 3A, 3B are cross sectional views for illustrating the initial step of the manufacturing process of the memory cell according to the first embodiment;

FIGS. 4A, 4B are cross sectional views for illustrating the step succeeding to the step of FIGS. 3A, 3B;

FIGS. 5A, 5B are cross sectional views for illustrating the step succeeding to the step of FIGS. 4A, 4B;

FIGS. 6A, 6B are cross sectional views for illustrating the step succeeding to the step of FIGS. 5A, 5B;

FIGS. 7A, 7B, 7C are cross sectional views for illustrating the step succeeding to the step of FIGS. 6A, 6B;

FIGS. 8A, 8B are cross sectional views for illustrating the step succeeding to the step of FIGS. 7A, 7B;

FIGS. 12A, 12B are partial cross sectional views of a memory cell array according to a third embodiment of this invention; and FIGS. 13A, 13B are partial cross sectional views of a memory cell array according to a fourth embodiment of this invention.

DETAILED DESCRIPTION OF THE PREFERRED EMBODIMENTS

There will now be described an embodiment of this invention with reference to the accompanying drawings.

[First Embodiment]

Figure 1:
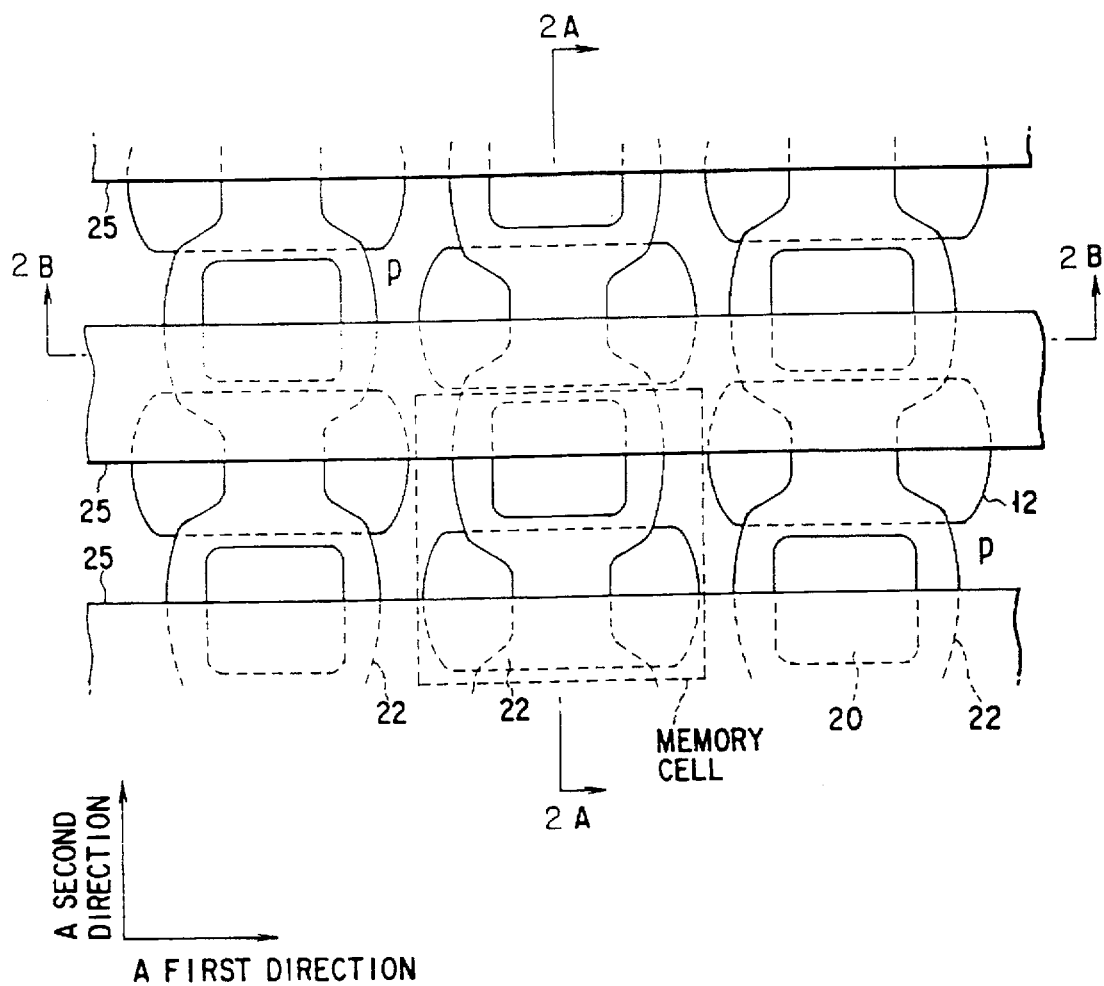
FIG. 1 is a partial plan view of a memory cell array according to a first embodiment of this invention.

FIG. 1 is a partial plan view of a memory cell array of a semiconductor memory device according to a first embodiment of this invention. An area defined by chain line in FIG. 1 indicates one memory cell. In this example, the semiconductor memory device is a DRAM (Dynamic Random Access Memory) and the memory cell is a DRAM cell. A plurality of bit line layers 25 are arranged in a first direction with the width of minimum patterning dimension F at an interval of minimum patterning dimension F. A plurality of word line layers 22 are arranged in a second direction perpendicular to the first direction with the width of minimum patterning dimension F at an interval of minimum patterning dimension F. Each memory cell includes a trench capacitor and a vertical MOS transistor disposed adjacent to the trench capacitor. The trench capacitors are formed in trenches 12 which are formed in a substrate. The vertical MOS transistors are formed in a silicon column 20 as the semiconductor column of the substrate, for example. The silicon column 20 is formed in the second direction in position adjacent to the trench 12. The silicon column 20 has the height (equal to or less than 1 μm) necessary for forming the vertical MOS transistor. As a result, the aspect ratio of the silicon column becomes small and collapse and destruction of the silicon column can be prevented.

A plurality of trenches 12 are discretely formed in a checkered configuration in the substrate. The opening of the trench 12 is formed with a rectangular form. One trench capacitor is formed in each of the trenches 12. The silicon columns 20 are formed adjacent to the respective trenches 12. The cross section of the silicon column 20 is made in a square form. One vertical MOS transistor is formed in each of the silicon columns 20. A plurality of silicon columns 20 and a plurality of trenches 12 are alternately arranged in each of the first and second directions. Each of the silicon columns 20 is surrounded by the adjacent four trenches 12. As a result, the vertical MOS transistor is isolated from another vertical MOS transistor.

Gate electrodes surrounding the side surfaces of the silicon column 20 are connected to word line layers 22. A drain layer formed on the top side of the silicon column 20 is connected to the bit line layer 25 via a contact hole.

The bit line layer 25 overlaps both of the trench capacitor and the adjacent vertical MOS transistor. The memory cell is disposed between the centers of the widths of the adjacent bit line layers 25. The center of the memory cell is set in alignment with the center between the adjacent bit line layers 25.

FIG. 2A is a cross sectional view taken along the line A-A' of FIG. 1. FIG. 2B is a cross sectional view taken along the line B-B' of FIG. 1. The upper portion of an n-type silicon substrate (which is hereinafter simply referred to as a substrate) 10 is converted into a p-type well 11 by diffusion of p-type impurity. Etching is effected from the surface of the p-type well 11 to the half-way portion of the substrate 10. As a result, the trenches 12 and silicon columns 20 are formed. A storage electrode 14 is buried in each of the trenches 12 with a capacitor insulation film 13 disposed therebetween. The trench capacitor is constructed by a plate electrode formed of the substrate 10, the storage electrode 14 buried in the trench 12 and the capacitor insulation film 13 disposed between the plate electrode and the storage electrode 14.

A vertical MOS transistor is formed in each of the p-type wells 11. A drain region 24 is formed in the top portion of the silicon column 20. The drain region 24 is connected to a bit line layer 25 via a bit line contact. The side surfaces of the silicon column 20 are surrounded by the word line layer 22 to form a gate region. A source region 18 is formed in the side portion of the silicon column 20 lying in position lower than the gate region. The source region 18 is connected to the storage electrode 14 via polysilicon films 16, 17. The polysilicon films 16, 17 are isolated from the p-type well 11 by a side wall insulation film 15.

Next, the manufacturing process of this embodiment is explained with reference to FIGS. 3A to 9A and 3B to 9B. FIGS. 3A to 9A are cross sectional views corresponding to the cross sectional view of FIG. 2A and FIGS. 3B to 9B are cross sectional views corresponding to the cross sectional view of FIG. 2B.

FIGS. 3A, 3B are cross sectional views for illustrating the initial step (first step) of the manufacturing process of the memory cell according to the first embodiment. The substrate 10 is etched to the depth of approx. 6 to 7 μm from the surface thereof with an $SiO_2$ film 31 and SiN film 32 used as a mask. Thus, the first trenches 12 are formed. As described before, the first trenches 12 are discretely arranged on the substrate surface in a checkered configuration and the opening thereof is made in a rectangular form. Then, p-type impurity is diffused from the surface of the substrate 10 to a depth of 2 μm, for example, which is larger than the height (1 μm) necessary for forming the vertical MOS transistor so as to form the p-type well 11 in the upper portion of the substrate 10.

FIGS. 4A, 4B are cross sectional views showing the second step. A polysilicon film used as the storage electrode 14 is buried in the trench 12 with the capacitor insulation film 13 disposed therebetween. The storage electrode 14 is formed to the bottom surface of the p-type well 11. Next, the insulation film 15 is formed on the side surface of the p-type well 11. Then, the polysilicon film 16 is buried on the storage electrode 14 to a position of a resist 32. The polysilicon films 14, 16 are formed by depositing polysilicon on the entire surface and then etching back the same to a preset depth.

FIGS. 5A, 5B are cross sectional views indicating the third step. The polysilicon film 16 is selectively etched with a resist 33 used as a mask. Next, the side wall insulation film 15 is removed by etching to expose part of the side surface of the p-type well 11.

FIGS. 6A, 6B are cross sectional views indicating the fourth step. A polysilicon film 17 including n-type impurities is buried in a concave portion surrounded by the exposed side surface of the p-type well 11, polysilicon film 16 and side wall insulation film 15. Next, the source region 18 is formed on one side surface of the p-type well 11 by diffusing n-type impurity from the polysilicon film 17. As a result, the source region 18 is connected to the storage electrode 14 via the polysilicon films 16, 17 and acts as a storage node contact. Next, an insulation film 19' is formed on the polysilicon films 16, 17 to a position higher than the p-type well 11.

Figure 7C:
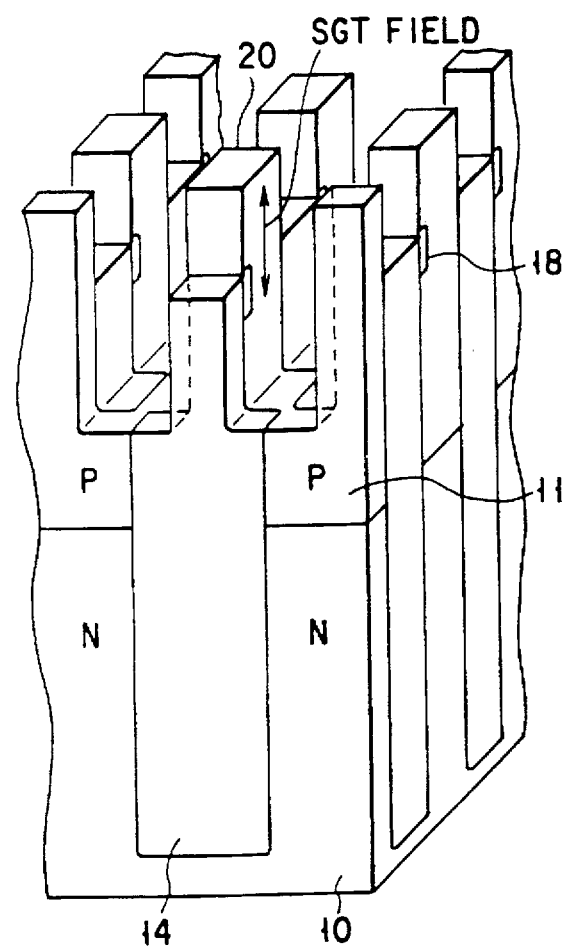

FIGS. 7A, 7B, 7C are views indicating the fifth step. FIG. 7C is a perspective view. Second trenches 20 and silicon columns 20 with the height of 1 μm or less are formed by etching the insulation film 19' and p-type wells 11 to the surface of the polysilicon films 16, 17 with the depth of approx. 0.5 to 1 μm as shown in FIG. 7C. A vertical MOS transistor is formed at a SGT field of the silicon column 20 in the later steps. The vertical MOS transistor formed in the silicon column 20 is isolated from another vertical MOS transistor by the insulation film 19', trench capacitor and trench 28 acting as an element isolation region.

FIGS. 8A, 8B are cross sectional views indicating the sixth step. After an insulation film is formed on the inner wall of the trench 28, the insulation film 19 is formed on the polysilicon films 16, 17 by etching back the above insulation film to a depth to cover the source region 18 of the p-type well 11. The side surface of the silicon column 20 is exposed in the channel region.

Figure 9A:
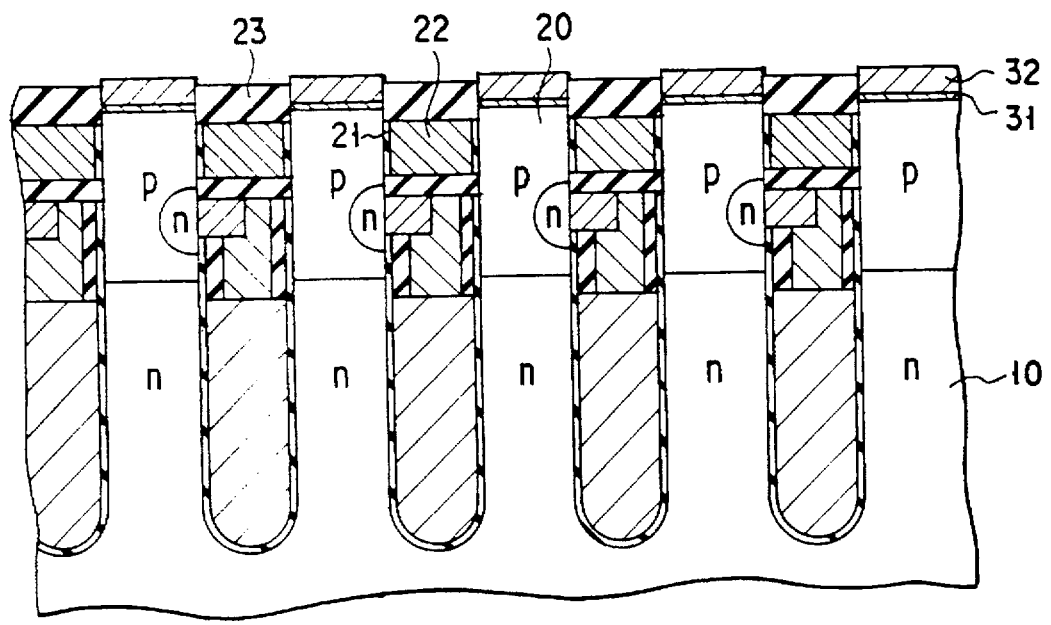
FIGS. 9A, 9B are cross sectional views for illustrating the step succeeding to the step of FIGS. 8A, 8B.
Figure 9B:
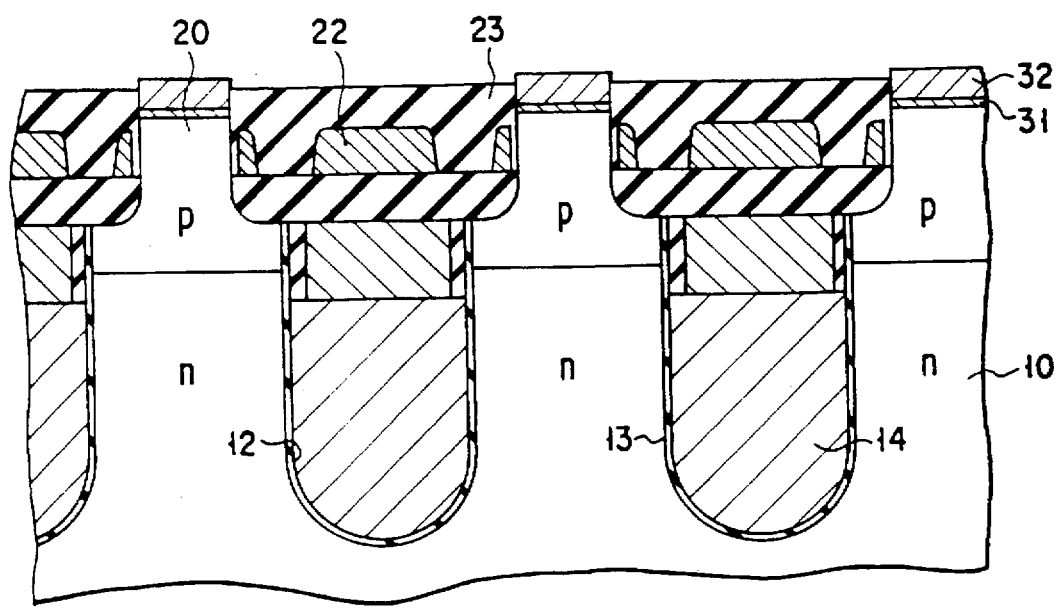

FIGS. 9A, 9B are cross sectional views indicating the seventh step. A gate electrode 22 is formed around the exposed side surface of the silicon column 20 with a gate oxide film 21 disposed therebetween. More specifically, after the gate electrode 22 is formed around the exposed side surface of the silicon column 20, a polysilicon film used for forming the gate electrode 22 is buried in the trench 28 to the height which is at least higher than the surface of the silicon column 20. Then, the polysilicon film is etched with a resist (not shown) used as a mask so that the polysilicon film may remain around the silicon column 20. Next, the polysilicon film is etched to the surface of the silicon column 20 by use of the entire RIE method. Then, an insulation film 23 is buried in the trench 28.

As the later step succeeding the seventh step, the step of removing an SiO$_2$ film 31 and SiN film 32 used as a trench mask member to expose the surface of the silicon column 20 is effected. Then, the drain region 24 of the vertical MOS transistor is formed on the top portion of the silicon column 20. Next, the bit line layer 25 is connected to the drain region 24 via a contact hole. As a result, the memory cell array shown in FIGS. 1, 2A, 2B is completed.

Thus, one memory cell (DRAM cell) is constructed by a trench capacitor and a vertical MOS transistor formed adjacent to the trench capacitor. Therefore, the height of the silicon column 20 on which the vertical MOS transistor is formed can be reduced and the aspect ratio thereof can be made small. As a result, collapse or destruction of the silicon column 20 by the stress caused in the manufacturing process can be prevented. Further, the trench 12 of the trench capacitor can be made sufficiently deep without considering the aspect ratio of the silicon column 20. Therefore, a sufficiently large capacitor area can be attained and necessary capacitance can be attained. Further, it is not necessary to form an element isolation region having normal LOCOS or insulation film buried in the trench between the memory cells. Therefore, the high integration density can be attained.

[Second Embodiment]

Figure 10:
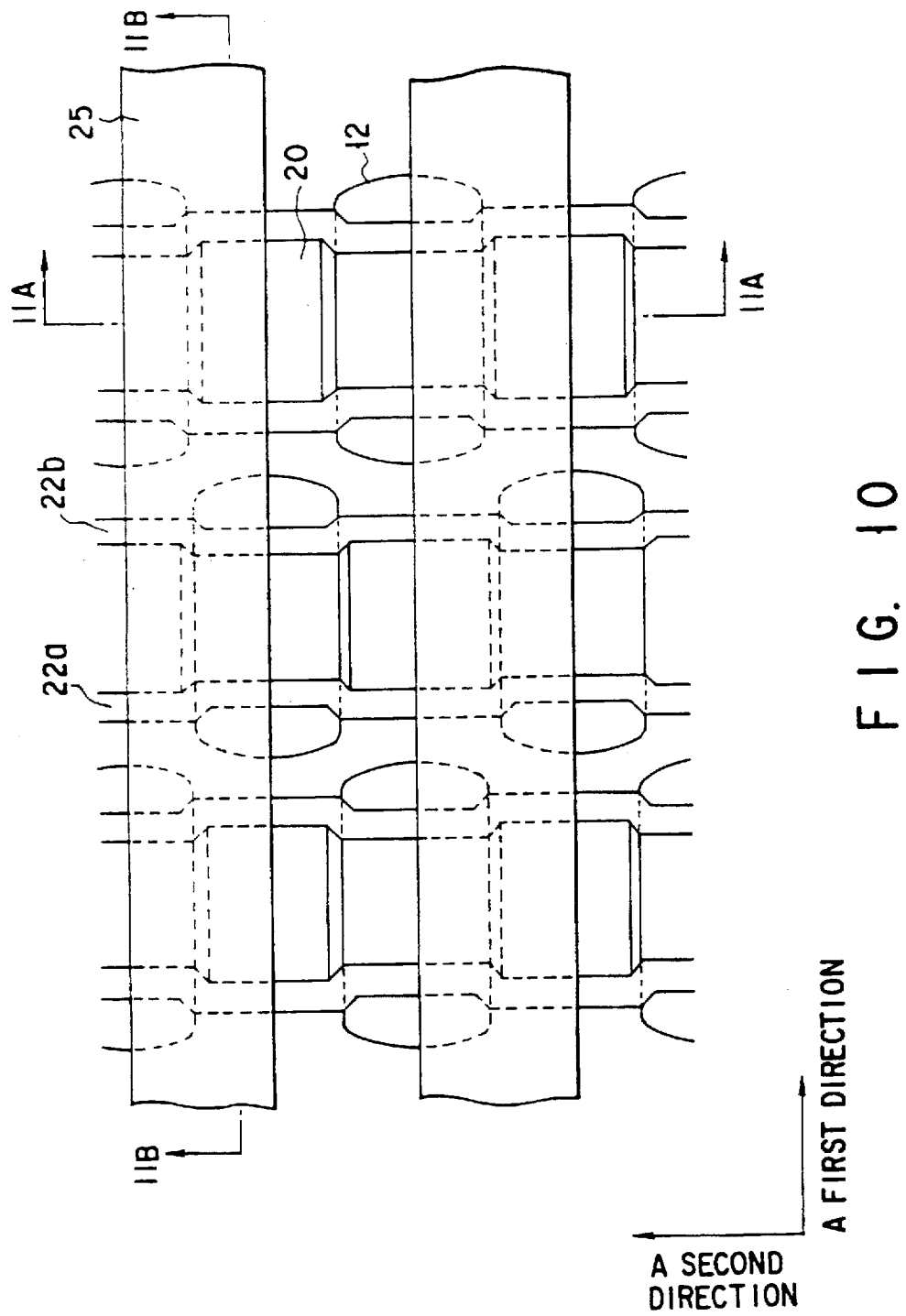
FIG. 10 is a partial plan view of a memory cell array according to a second embodiment of this invention.
Figure 11A:
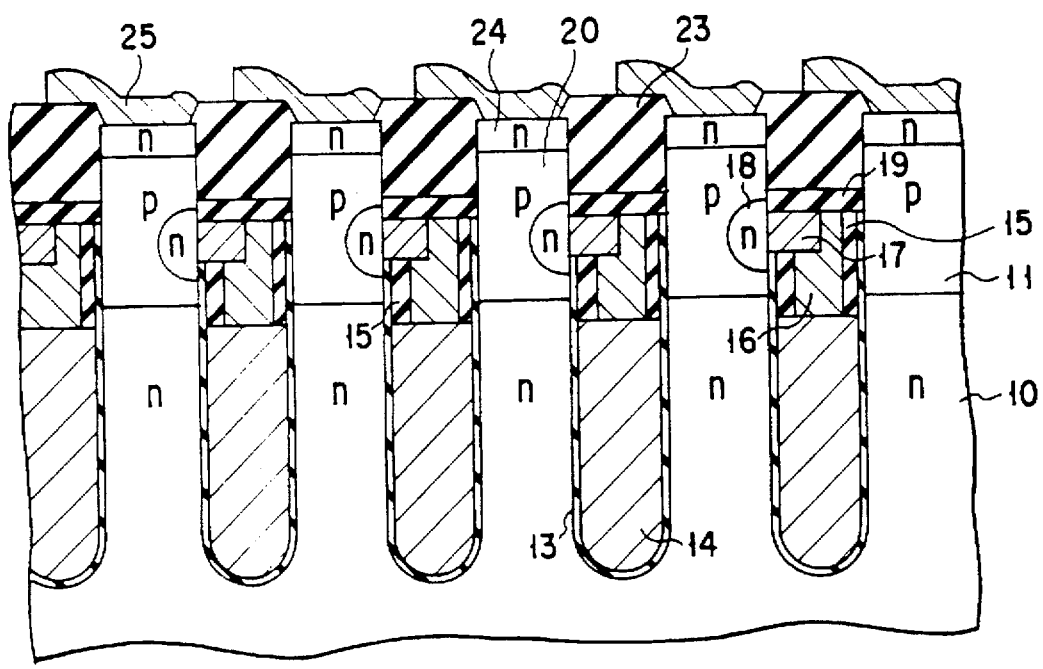
FIG. 11A is a cross sectional view taken along the line A-A' of FIG. 10.
Figure 11B:
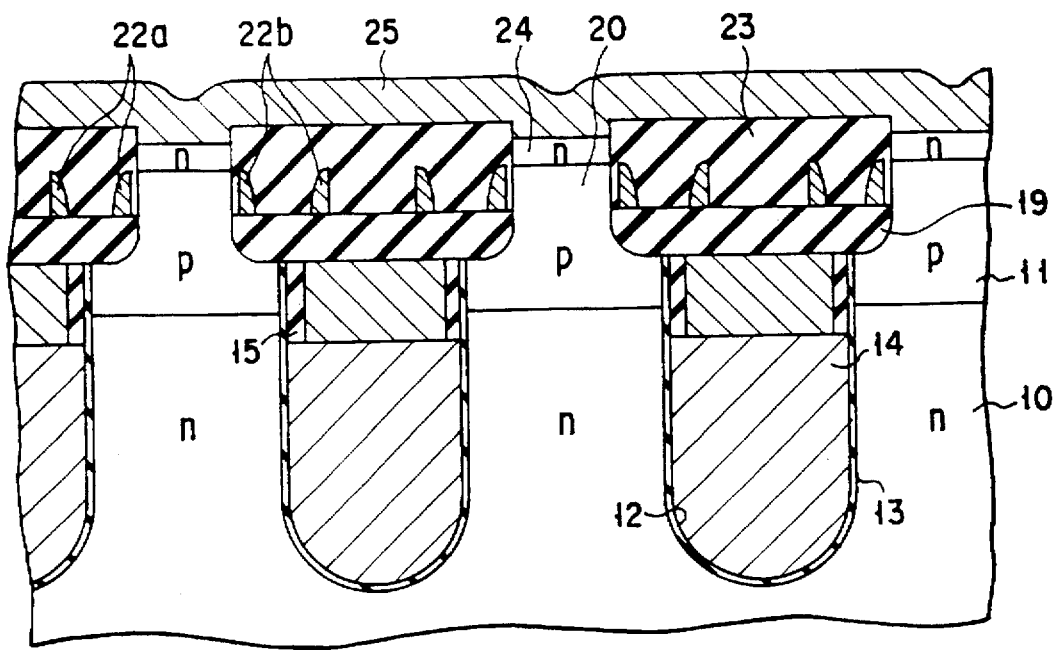
FIG. 11B is a cross sectional view taken along the line B-B' of FIG. 10.
Figure 11C:
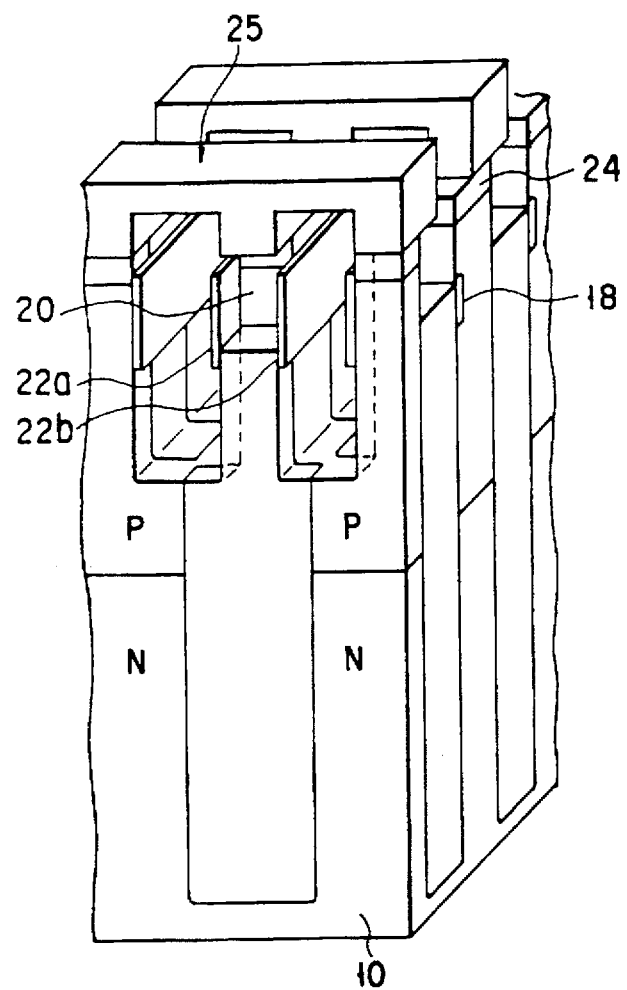
FIG. 11C is a perspective view of the memory cell of FIG. 10.

FIG. 10 is a partial plan view of a memory cell array according to a second embodiment of this invention. FIG. 11A is a cross sectional view taken along the line A-A' of FIG. 10, FIG. 11B is a cross sectional view taken along the line B-B' of FIG. 10, and FIG. 11C is a perspective view of the main portion. In FIGS. 10, 11A, 11B, 11C, portions which are the same as those of FIGS. 1, 2A, 2B are denoted by the same reference numerals.

The inherent feature of the second embodiment over the first embodiment is that the word line layer 22 is not formed to surround the silicon column 20, but two word line layer portions 22a, 22b constructing the word line layer 22 put side wall of the silicon column 20. The other structure thereof is the same as that of the first embodiment. In the above structure, when the second trench 28 is formed in the step of FIGS. 7A, 7B, 7C of the first embodiment, the insulation film 19' is left in the second direction. Then, in the step of FIGS. 9A, 9B of the first embodiment, the word line layer portions 22a, 22b are formed on the exposed side surfaces of the silicon column 20 with gate oxide films 21 respectively disposed therebetween. More specifically, after the gate oxide films 21 are formed on the exposed side surfaces of the silicon column 20, a polysilicon film used for forming the word line layer portions 22a, 22b is buried in the trench 28 to the height which is at least higher than the surface of the silicon column 20. Then, the polysilicon film is etched with a resist (not shown) used as a mask so as to be left on the opposite side surfaces of the silicon column 20. Next, an insulation film 23 is buried in the trench 28.

With the above structure, the following effect can be obtained. In this embodiment, the lithography process for connecting the gates of the vertical transistors can be omitted and the number of steps can be reduced.

[Third Embodiment]

FIGS. 12A, 12B are partial cross sectional views of a memory cell array according to a third embodiment of this invention. The third embodiment has a feature that a step portion is formed between the silicon column 20 in which the vertical MOS transistor is formed and the trench 12 in the trench capacitor and a storage node contact 29 is formed in this step portion.

The stepped structure is formed by forming the first trench 12 by use of two etching steps for attaining different etching amounts instead of the etching step of FIGS. 3A, 3B of the first embodiment. More specifically, after trenches are formed to the depth of approx. 0.5 to 0.7 μm in the same trench pattern as that of the first embodiment and SiO$_2$ side walls are formed, the trenches are further formed to the depth of 6 to 7 μm. After a capacitor insulation film 13 and polysilicon film 14 for storage electrode are deposited and buried in each trench, the polysilicon film 14 is etched by use of a resist mask to expose part of the capacitor insulation film 13 on one side surface of the trench 12 and the exposed part of the capacitor insulation film 13 is removed.

After this, a polysilicon film is buried in the trench and n-type impurity is diffused from the polysilicon film so as to form a source region 18 of the vertical MOS transistor. Then, the polysilicon film is etched back from the substrate surface to the depth of approx. 0.5 to 0.7 μm, an oxide film is buried therein, a second trench 28 is formed to form the silicon column 20, and the vertical MOS transistor is then formed therein.

In this embodiment, it is possible to prevent the side surface of a portion in which the vertical MOS transistor is formed from being damaged in the SN contact step and stably set the height of the SN contact portion.

[Fourth Embodiment]

FIGS. 13A, 13B are partial cross sectional views of a memory cell array according to a fourth embodiment of this invention. The fourth embodiment is different from the first embodiment in the connection method for connecting the bit line layer 25 to the drain region 24 on the top portion of the silicon column 20 and the other structure in the fourth embodiment is the same as that of the first embodiment. In the first embodiment, the drain region 25 is connected to the bit line layer 25 via the contact hole. When the contact structure is used, there occurs a possibility that the contact becomes defective by misalignment or adjacent vertical MOS transistors will be short-circuited.

In the fourth embodiment, the tolerance for misalignment between the bit line contact and the drain region 24 is provided so as to prevent the contact from being defective and prevent the adjacent vertical MOS transistors from being short-circuited.

To serve the above purpose, in the fourth embodiment, a bit line contact 30 is deviated towards a corresponding bit line layer 25 by F/4 and arranged at a distance of F/4 from the end of the drain region 24.

Therefore, even if the bit line contact 30 is deviated in the first direction within the range of F/4 in the actual manufacturing process, the deviation can be tolerated and occurrence of defective contact and the short circuit between adjacent vertical MOS transistors can be prevented.

As described above, in this invention, the vertical MOS transistor is formed in position adjacent to the trench capacitor. With this structure, the height of the silicon column in which the vertical MOS transistor is formed can be set to a value of 1 μm or less which is necessary for forming the transistor to reduce the aspect ratio of the silicon column, thereby making it possible to prevent collapse or destruction of the silicon column. Further, since the laminating technique is not necessary, it can be manufactured at low cost. In addition, since the substrate is not set in the electrically floating state, the problem that it cannot be cut off can be solved. Further, by disposing the trench to surround the vertical MOS transistor, it can be isolated from another vertical MOS transistor and the high integration density can be attained.

This invention is not limited to the above embodiments and can be variously modified without departing the technical scope thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A manufacturing process of a semiconductor memory device, comprising:

a step of forming a plurality of first trenches in a checkered configuration in a substrate, each of said first trenches having an opening;

a step of introducing a first conductivity type impurity from a surface of the substrate so as to form a first conductivity type well in a upper portion of the substrate;

a step of forming a capacitor insulating film on a surface of each of the first trenches and burying a storage electrode in each of the first trenches so as to form a trench capacitor in each of the first trenches;

a step of burying a first silicon film on each of the storage electrodes of the trench capacitors in the first trenches, etching back each of portions of the first silicon film and removing each of portions of the capacitor insulating films so as to expose portions of side surfaces of the first conductivity type well facing the first trenches;

a step of burying a second silicon film doped with a second conductivity type impurity in each of concave portions surrounded by the first silicon films and exposing side surfaces of the first conductivity type well facing the first trenches, and introducing second conductivity type impurities to the first conductivity type well so as to form source regions; and a step of burying a first insulation material on the first and second silicon films in each of the first trenches.

2. The manufacturing process of a semiconductor memory device according to claim 1, further comprising:

a step of forming a second trench in each of portions of the first insulation materials and portions of a first conductivity well by etching down to a depth between bottoms of the source regions and bottoms of the first conductivity type well so as to form silicon columns;

a step of burying a second insulation material in each of the second trenches, and etching back the first and second insulation materials down to a depth of an upper surface of the source region;

a step of forming a gate insulating film on exposed side surfaces of each of the silicon columns, burying a first conductive film in each of the second trenches and spaces between silicon columns, and etching back the first conductive film so as to leave a gate electrode surrounding each silicon column, and burying a third insulation material in the second trenches; and a step of forming a drain region in each top of silicon columns and connecting a bit line to each of the drain regions.

3. The manufacturing process of a semiconductor memory device according to claim 2, comprising:

a step of disposing a bit line contact deviated towards a corresponding bit line layer by a fraction of a distance between opposite faces of adjacent bit lines, and arranged at said fraction of distance from the end of drain region.

4. The manufacturing process of a semiconductor memory device according to claim 1, further comprising:

a step of forming a second trench in each of the first insulation materials and portions of a first conductivity well by etching down to a depth between bottoms of the source regions and bottoms of the first conductivity type well so as to form silicon columns, while leaving the portions of first insulation materials between the second trenches substantially up to the height of a surface of the first conductivity type well;

a step of burying a second insulation material in each of the second trenches, and etching back the second insulation materials down to a depth of an upper surface of the source region;

a step of forming a gate insulating film on exposed side surfaces of each of the silicon columns, burying a second conductive film in each of the second trenches, and etching back the second conductive film so as to leave a gate electrode on a side wall of each silicon column, and burying a third insulation material in the second trenches; and a step of forming a drain region in each top of silicon columns and connecting a bit line to each of the drain regions.

5. The manufacturing process of a semiconductor memory device according to claim 4, comprising:

a step of disposing a bit line contact deviated towards a corresponding bit line layer by a fraction of a distance between opposite faces of adjacent bit lines, and arranged at said fraction of distance from the end of drain region.

6. A manufacturing process of a semiconductor memory device, comprising;

a step of forming a plurality of first trenches in a checkered configuration in a substrate, each of said first trenches having an opening;

a step of forming an insulating film on a side wall of each first trench and forming a second trench having a smaller opening than that of the first trench deeper under from a bottom of each first trench;

a step of introducing a first conductivity type impurity from a surface of the substrate so as to form a first conductivity type well in an upper portion of the substrate;

a step of forming a capacitor insulating film on a side wall of each of second trenches, burying a first conductive film in each of second trenches so as to form a storage electrode, etching back the first conductive film in each of second trenches so as to expose a portion of the capacitor insulating film, and removing a part of the portion of the capacitor insulating film;

a step of burying a silicon film doped with a second conductivity type impurity in each of the second trenches and introducing second conductivity type impurities to the first conductivity well so as to form source regions; and a step of burying a first insulation material in each of the first trenches on the silicon film.

7. The manufacturing process of a semiconductor memory device according to claim 6, further comprising:

a step of forming a gate insulating film on exposed side surfaces of each of the first trenches, burying a second conductive film in each of the first trenches, and etching back the second conductive film so as to leave a gate electrode on a side wall of each first trench, and burying a second insulation material in the first trenches; and a step of forming a drain region in each top of the substrate and connecting a bit line to each of the drain regions.

8. The manufacturing process of a semiconductor memory device according to claim 7, including:

a step of disposing a bit line contact deviated towards a corresponding bit line layer by a fraction of a distance between opposite faces of adjacent bit lines, and arranged at said fraction of distance from the and of drain region.

* * * * *